United States Patent
Koide et al.

(10) Patent No.: US 6,806,115 B2
(45) Date of Patent: Oct. 19, 2004

(54) SEMICONDUCTOR LIGHT EMITTING DEVICE AND METHOD FOR PRODUCING THE SAME

(75) Inventors: Norikatsu Koide, Nagoya (JP); Junji Yamamoto, Kitakatsuragi-gun (JP); Tsuyoshi Dohkita, Yamatotakada (JP); Nobuhiko Sawaki, Chikusanishijutaku 3-103, 1-6-33, Kitachikusa, Chikusa-ku, Nagoya-shi, Aichi (JP); Yoshio Honda, Nagoya (JP); Yousuke Kuroiwa, Matsusaka (JP); Masahito Yamaguchi, Ngoya (JP)

(73) Assignees: Sharp Kabushiki Kaisha, Osaka (JP); Nobuhiko Sawaki, Nagoya (JP)

( * ) Notice: Subject to any disclaimer, the term of this patent is extended or adjusted under 35 U.S.C. 154(b) by 44 days.

(21) Appl. No.: 10/285,170

(22) Filed: Oct. 30, 2002

(65) Prior Publication Data

US 2003/0087462 A1 May 8, 2003

(30) Foreign Application Priority Data

Nov. 2, 2001 (JP) ........................ 2001-338536

(51) Int. Cl.[7] .............................................. H01L 21/00
(52) U.S. Cl. ............................. 438/44; 438/34; 438/41; 438/46
(58) Field of Search ............................. 438/22, 29, 34, 438/39, 41, 44, 46; 257/79

(56) References Cited

U.S. PATENT DOCUMENTS

| 4,484,332 | A | * | 11/1984 | Hawrylo ........................ 372/50 |
| 5,288,657 | A | * | 2/1994 | Feygenson et al. ........... 117/95 |
| 5,300,788 | A | * | 4/1994 | Fan et al. ....................... 257/13 |
| 5,514,619 | A | * | 5/1996 | Wakabayashi et al. ........ 438/44 |
| 5,723,360 | A | * | 3/1998 | Iwasaki ........................ 438/41 |
| 5,728,605 | A | * | 3/1998 | Mizutani ...................... 438/41 |
| 6,342,404 | B1 | * | 1/2002 | Shibata et al. ................ 438/46 |
| 6,469,320 | B2 | * | 10/2002 | Tanabe et al. ................. 257/79 |
| 6,582,984 | B2 | * | 6/2003 | Peng ............................ 438/44 |

FOREIGN PATENT DOCUMENTS

| JP | 10-135140 | 5/1998 |
| JP | 10-321911 | 12/1998 |

* cited by examiner

*Primary Examiner*—Matthew Smith
*Assistant Examiner*—Lex H. Malsawma
(74) *Attorney, Agent, or Firm*—Morrison & Foerster LLP

(57) ABSTRACT

A method for producing a semiconductor light emitting device includes the steps of forming a mask layer having a plurality of openings on a surface of a silicon substrate; and forming a column-like multi-layer structure including a light emitting layer in each of the plurality of openings with nitride semiconductor materials. A width between two adjacent openings of the plurality of openings of the mask layer is 10 μm or less.

11 Claims, 8 Drawing Sheets

SEMICONDUCTOR LIGHT EMITTING DEVICE AND METHOD FOR PRODUCING THE SAME

BACKGROUND OF THE INVENTION

1. Field of the Invention

The present invention relates to a method for producing a semiconductor light emitting device, and specifically a method for producing a semiconductor light emitting device including a nitride semiconductor layer as a light emitting layer on a silicon substrate; and a semiconductor light emitting device produced by such a method.

2. Description of the Related Art

A light emitting device using a nitride semiconductor material, such as GaN, InN, AlN, or a mixed crystal thereof, usually includes a nitride semiconductor layer formed of, for example, $In_xGa_{1-x}N$ crystals, as a light emitting layer on a sapphire substrate.

Recently, silicon (Si) substrates which are less expensive and have a larger area than a sapphire substrate have been produced. A nitride semiconductor light emitting device can be produced at lower cost by using such an Si substrate instead of a sapphire substrate.

A nitride semiconductor light emitting device produced using an Si substrate has the following problem. A nitride semiconductor layer has a larger thermal expansion coefficient than that of an Si substrate. When the temperature is once raised for epitaxial growth and then is lowered to room temperature, the nitride semiconductor layer shrinks more significantly than the Si substrate, due to the difference in the thermal expansion coefficient between the Si substrate and the nitride semiconductor layer.

FIG. 12 is a schematic perspective view of a nitride semiconductor light emitting device 500 using an Si substrate 91. As shown in FIG. 12, when the temperature is raised to form a nitride semiconductor layer 92 on the Si substrate 91 by epitaxial growth and then lowered to room temperature, the nitride semiconductor layer 92 significantly shrinks. As a result, tensile stress is applied to an interface between the Si substrate 91 and the nitride semiconductor layer 92, thus possibly causing cracks 93.

In the case of a nitride semiconductor light emitting device having a double-hetero structure, when the cracks 93 are generated, an invalid leak current which does not contribute to light emission is increased in magnitude. This prevents output of high luminance emission. In order to produce a nitride semiconductor device having a long life and high luminance emission, it is indispensable to prevent the generation of such cracks 93.

FIG. 13 is a schematic cross-sectional view illustrating a production step of another conventional semiconductor light emitting device 600.

The semiconductor light emitting device 600 is produced as follows. A mask layer 41B having openings (windows) 42B is formed on an Si substrate 91A using an oxide layer or the like, and then a nitride semiconductor layer 92A is formed in each of the openings 42B of the mask layer 41B by epitaxial growth. Owing to such a step, a tensile stress applied to an interface between the Si substrate 91A and the nitride semiconductor layer 92A is alleviated, thus preventing the generation of cracks.

This method has the following problem. Depending on the size of the mask layer 41B, the width and material of the mask layer 41B, and the growth temperature and rate, the material used for the epitaxial growth remains on the mask layer 41B. This raises the concentration of the material in a peripheral portion of the nitride semiconductor layer 92A in the opening 42B, which is in the vicinity of the mask layer 41B, is excessively high. As a result, as shown in FIG. 13, the peripheral portion of the nitride semiconductor layer 92A in the opening 42B is about three times as thick as a central portion thereof, due to growth referred to as "edge growth". Such a thick peripheral portion is subjected to significant local distortion, and as such is susceptible to being cracked.

As described above, the method of forming the nitride semiconductor layer 92A by epitaxial growth in the opening 42B prevents the central portion thereof from being cracked, but has a risk of causing cracks in the peripheral portion of the nitride semiconductor layer 92A due to the local distortion applied to the thick portion.

When a substrate formed of a material having a smaller thermal expansion coefficient than a nitride semiconductor material, such as Si, it is difficult to produce a nitride semiconductor light emitting device having a long life and high luminance emission, with prevention of crack generation. It is not sufficient to form a nitride semiconductor layer in an opening by epitaxial growth.

SUMMARY OF THE INVENTION

According to one aspect of the invention, a method for producing a semiconductor light emitting device includes the steps of forming a mask layer having a plurality of openings on a surface of a silicon substrate; and forming a column-like multi-layer structure including a light emitting layer in each of the plurality of openings with nitride semiconductor materials. A width between two adjacent openings of the plurality of openings of the mask layer is 10 $\mu$m or less.

According to another aspect of the invention, a method for producing a semiconductor light emitting device includes the steps of forming a mask layer having a plurality of openings on a surface of a silicon substrate; and forming a column-like multi-layer structure including a light emitting layer in each of the plurality of openings with nitride semiconductor materials. A width between two adjacent openings of the plurality of openings of the mask layer is in the range of twice a thickness of the column-like multi-layer structure to 40 $\mu$m, the thickness being in a direction vertical to the planar direction of the silicon substrate.

In one embodiment of the invention, the method for producing a semiconductor light emitting device further includes the steps of removing the mask layer and providing an insulating layer for electrically insulating the column-like multi-layer structures from each other on an area of the surface of the silicon substrate from which the mask layer has been removed, and forming a transparent electrode for electrically connecting the column-like multi-layer structures to each other.

In one embodiment of the invention, the method for producing a semiconductor light emitting device further includes the steps of forming a transparent electrode on each column-like multi-layer structure; and dividing an assembly of the silicon substrate and the column-like multi-layer structures into a plurality of chips, such that each chip includes one column-like multi-layer structure.

In one embodiment of the invention, the plurality of openings are each square or rectangular. The plurality of openings each have a side in the range of 50 $\mu$m to 150 $\mu$m.

In one embodiment of the invention, the plurality of openings are each square or rectangular. The plurality of openings each have a side in the range of 200 $\mu$m to 300 $\mu$m.

In one embodiment of the invention, each column-like multi-layer structure includes a hexagonal-system gallium nitride-based compound semiconductor material. The plurality of openings are polygonal. At least one side of each polygonal opening is parallel to a <11-20> axis of the gallium nitride-based compound semiconductor material.

In one embodiment of the invention, the silicon substrate has an Si (111) plane. A <1-10> axis of the silicon substrate is parallel to the <11-20> axis of the gallium nitride-based compound semiconductor material.

In one embodiment of the invention, the mask layer is formed of a material selected from the group consisting of silicon oxide, silicon nitride, and aluminum oxide.

According to still another aspect of the invention, a semiconductor light emitting device produced by the above-described.

Thus, the invention described herein makes possible the advantages of providing a method for producing a semiconductor light emitting device using an Si substrate and still preventing cracks from being generated at an interface between the Si substrate and a nitride semiconductor layer; and a semiconductor light emitting device produced by such a method.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. In this specification, the term "column-like multi-layer structure" refers to a nitride semiconductor layer which is formed on a part of an Si substrate by epitaxial growth. The term "semiconductor light emitting device" refers to a light emitting device including at least one column-like multi-layer structure on the Si substrate.

EXAMPLE 1

Figure 1:
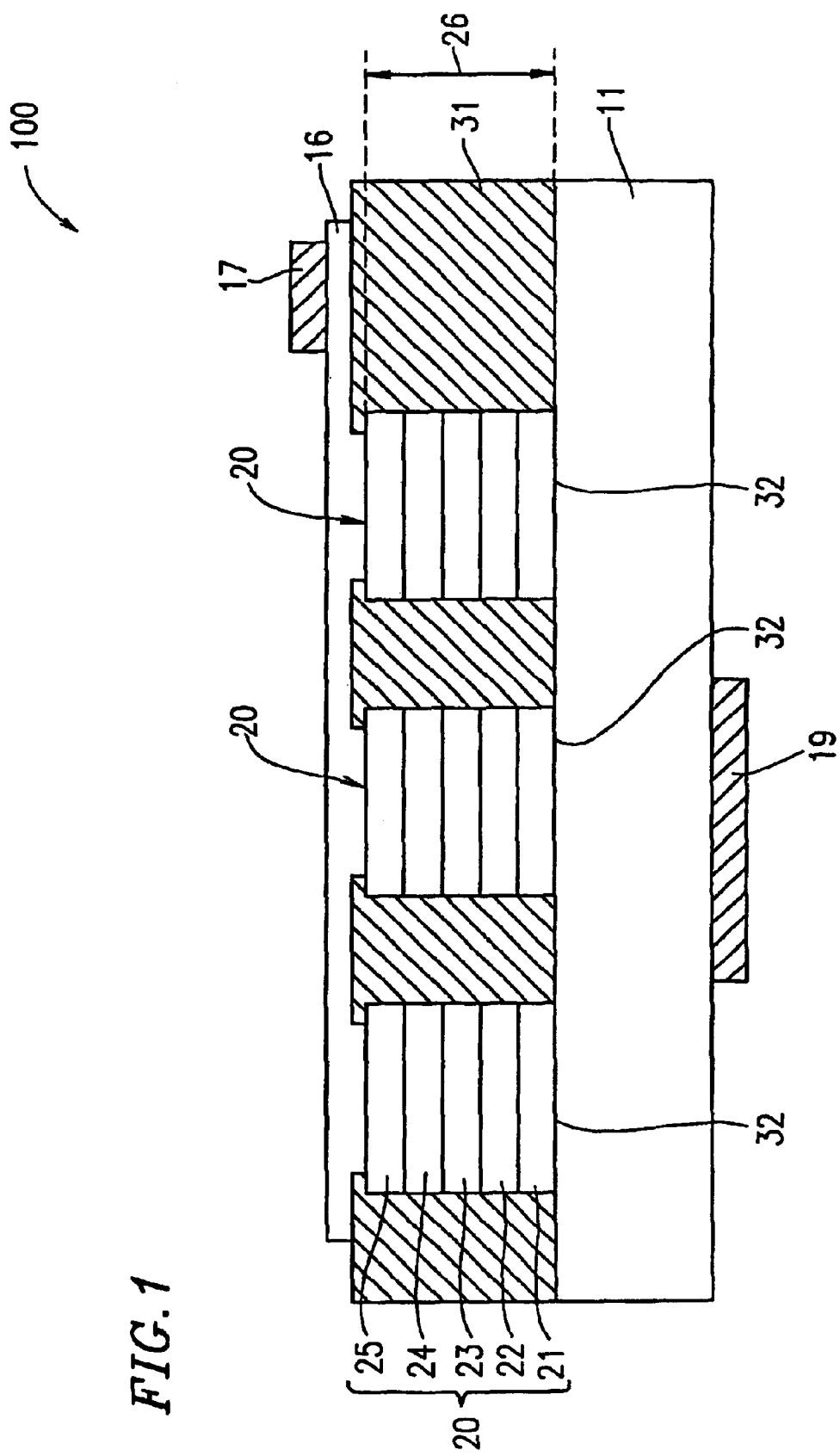
FIG. 1 is a schematic cross-sectional view of a semiconductor light emitting device according to a first example of the present invention.
Figure 2:
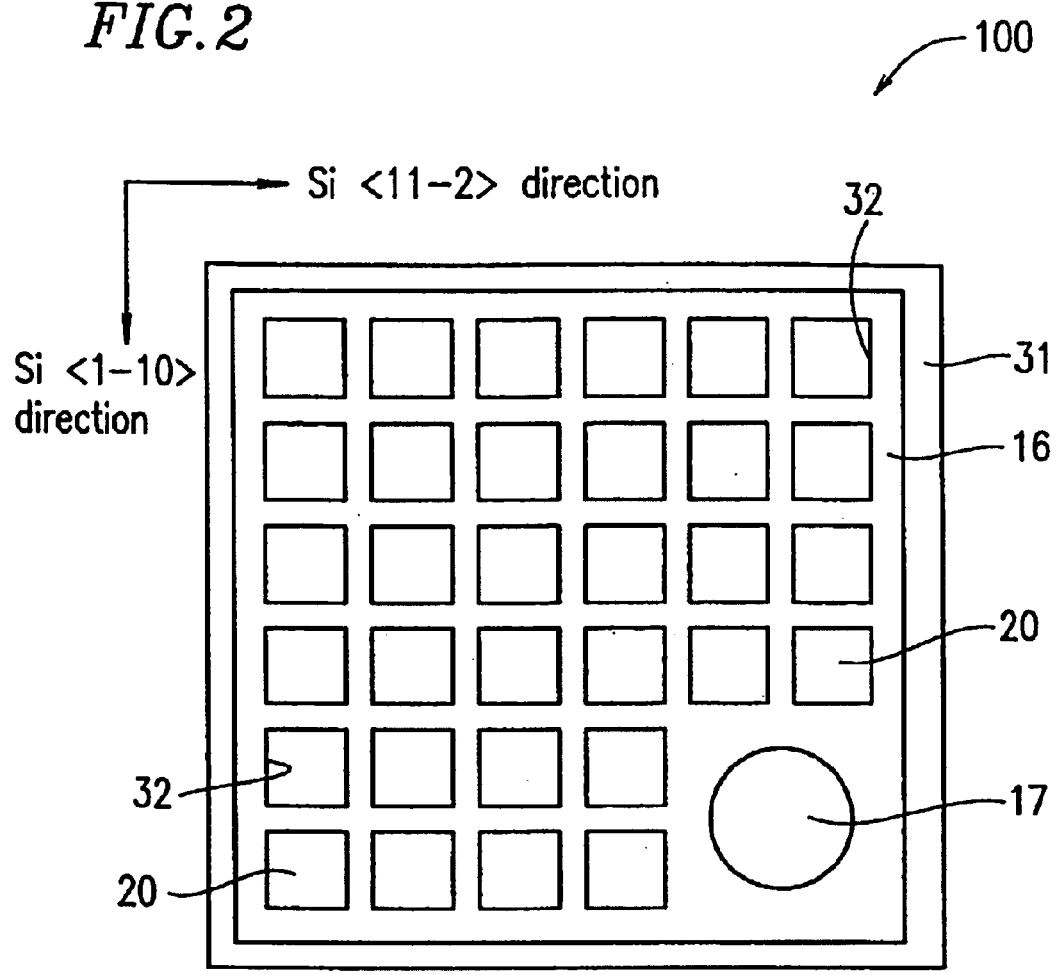
FIG. 2 is a schematic plan view of the semiconductor light emitting device shown in FIG. 1.

FIG. 1 is a schematic cross-sectional view of a nitride semiconductor light emitting device 100 according to a first example of the present invention. FIG. 2 is a schematic plan view of the nitride semiconductor light emitting device 100. The nitride semiconductor light emitting device 100 includes an Si substrate 11 having a (111) plane and an insulating layer 31 provided on the Si substrate 11. The insulating layer 31 has an appropriate thickness and covers a surface of the Si substrate 11 except for portions on which a nitride is to be grown. The insulating layer 31 contains, for example, $SiO_2$.

The insulating layer 31 has a plurality of openings 32 except in a position of at least one of the four corners thereof. In each of the openings 32, a column-like multi-layer structure 20 is formed by growing a nitride semiconductor material. The openings 32 pass through the insulating layer 31 so as to expose the surface of the Si substrate 11. The openings 32 are square, and are provided in a matrix in an Si <11-2> direction and an Si <1-10> direction in which the nitride semiconductor material is crystal-grown in the openings 32. The <11-2> direction and the <1-10> direction are perpendicular to each other.

The column-like multi-layer structure 20 includes a buffer layer 21 provided on the surface of the Si substrate 11. The buffer layer 21 contains Si-doped n-AlInN. The column-like multi-layer structure 20 further includes a first clad layer 22 containing n-GaInN, a light emitting layer 23 containing $In_xGa_{1-x}N$, a carrier block layer 24 containing p-AlGaInN, and a second clad layer 25 containing p-GaInN. The layers 22, 23, 24 and 25 are stacked on the buffer layer 21 in this order. The column-like multi-layer structure 20 has a designed thickness 26. The designed thickness 26 is a thickness in a direction perpendicular to the planar direction of the Si substrate 11.

The column-like multi-layer structure 20 is buried in the insulating layer 31. A top surface of the insulating layer 31 is substantially entirely covered with a transparent electrode 16, so that a top surface of each of the column-like multi-layer structure 20, i.e., the second clad layer 25, contacts the transparent electrode 16. In this manner, all the column-like multi-layer structures 20 are electrically connected to each other.

On a corner of the transparent electrode 16, a cylindrical bonding electrode 17 is provided for externally supplying electric current to the transparent electrode 16. On a bottom surface of the Si substrate 11, a rear electrode 19 is provided.

The light emitting layer 23 can provide various wavelengths of band-to-band emission from an ultraviolet range to a red range by changing the ratio x of $In_xGa_{1-x}N$. In this example, the ratio x of In is set such that the light emitting layer 23 emits blue light.

The transparent electrode 16 connected to the second clad layer 25 contains a metal layer or an ITO layer having a thickness of 20 nm or less. The ITO layer preferably contains at least one metals of Ta, Co, Rh, Ni, Pd, Pt, Cu, Ag and Au.

The rear electrode 19 contains a metal, preferably at least one of Al, Ti, Zr, Hf, V and Nb.

The nitride semiconductor light emitting device 100 having the above-described structure is produced in the following manner.

Figure 3:
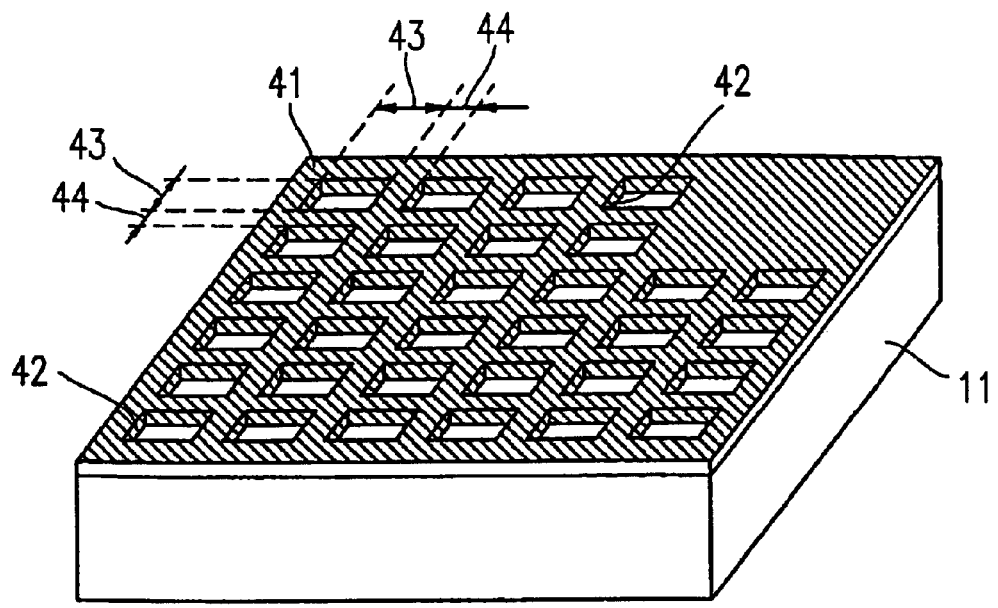
FIG. 3 is a schematic isometric view of a laminate obtained during the production of the semiconductor light emitting device shown in FIG. 1.

First, steps for forming a mask layer 41 having a plurality of mask openings 42 will be described with reference to FIG. 3 (isometric view).

After the Si substrate 11 is washed, an $SiO_2$ layer to be formed into the mask layer 41 is deposited on the Si substrate 11 by sputtering to a prescribed thickness (e.g., 100 nm). In the $SiO_2$ layer, the plurality of mask openings 42, in each of which the column-like multi-layer structure 20 is to be epitaxially grown, are formed in a prescribed matrix by photolithography and etching. Thus, the mask layer 41 is formed. Each mask opening 42 is square in this example, but may be rectangular. Each mask opening 42 has a width 43 of about 100 μm. An inter-opening distance 44 between every two adjacent mask openings 42 is about 5 μm.

According to the experimental results obtained by the present inventors, the width 43 is preferably in the range of 50 μm to 150 μm, and the inter-opening distance 44 is preferably 40 μm or less. When the inter-opening distance 44 is 40 μm or less, the concentration distribution of the nitride semiconductor material staying on the mask layer 41 is uniform in a direction parallel to the surface of the Si substrate 11. Therefore, the problem of the conventional device that, the concentration of the material is especially high in a peripheral portion of the column-like multi-layer structure 20 in the mask opening 42 in the vicinity of the mask layer 41, is avoided. The column-like multi-layer structure 20 is grown so as to have a uniform thickness entirely in each mask opening 42 without edge growth, which reduces the occurrence of the cracks. When the width 43 is larger than 40 μm, the edge growth is likely to occur, which causes cracks.

The inter-opening distance 44 is more preferably 10 μm or less. When the inter-opening distance 44 is 10 μm or less, the column-like multi-layer structure 20 has a more uniform thickness in the peripheral portion thereof. Therefore, the magnitude of a leak current caused by the existence of cracks is reduced, and thus the characteristics of the nitride semiconductor light emitting device 100 are improved.

The inter-opening distance 44 is preferably at least twice as great as the designed thickness 26 of the column-like multi-layer structure 20, for the following reason. Crystal growth of the column-like multi-layer structure 20 proceeds in a thickness direction which is vertical to the planar direction of the Si substrate 11 and also in a lateral direction which is parallel to the planar direction of the Si substrate 11 at substantially the same rate. Therefore, when the inter-opening distance 44 is less than twice the designed thickness 26, two adjacent column-like multi-layer structures 20 are combined together, which results in a high possibility of crack generation.

Based on the above-described experimental results obtained by the present inventors, the inter-opening distance 44 is preferably in the range of twice the designed thickness 26 to 40 μm. With the inter-opening distance 44 in this range, the degree of edge growth is negligibly small and two adjacent column-like multi-layer structures 20 are not combined together. Thus, the nitride semiconductor light emitting device 100 is almost crack-free.

Next, steps for forming the column-like multi-layer structure 20 in the mask openings 42 will be described with reference to FIG. 4 (schematic cross-sectional view).

After the plurality of mask openings 42 are formed in the mask layer 41 so as to expose the surface of the Si substrate 11, the surface of the Si substrate 11 is washed and an assembly of the Si substrate 11 and the mask layer 41 is put into an MOCVD apparatus. The Si substrate 11 is washed at a temperature of as high as 1100° C. in a hydrogen ($H_2$) atmosphere.

Then, the column-like multi-layer structure 20 is grown as follows. While supplying $N_2$ as a carrier gas at a flow rate of 10 L/min. to the MOCVD apparatus, $NH_3$, trimethyl aluminum (TMA) and trimethyl indium (TMI; a material for indium) are supplied at 800° C., at respective flow rates of 5 L/min., 20 μmol/min., and 137 μmol/min. Several seconds later, $SiH_4$ gas is introduced to the MOCVD apparatus, thereby performing Si doping. Thus, the buffer layer 21 of $Al_{0.85}In_{0.15}N$ is grown in each mask opening 42 to a thickness of about 30 nm.

In the above-described crystal growth of MOVPE, organic metals (TMA and TMI) as a group III gas are supplied several seconds before $NH_3$ gas of group V. This flattens the buffer layer 21, for the following possible reason. In the case where $NH_3$ gas is supplied before the organic metals, the surface of the Si substrate 11 is nitrided. By contrast, when the organic metals are supplied before $NH_3$ gas, the surface of the Si substrate 11 is prevented from being nitrided, and a group III element is provided on the surface of the Si substrate 11. The precise timing for supplying the organic metals before the $NH_3$ gas varies depending on the specifications of the MOCVD apparatus.

Before providing the buffer layer 21, it is preferable to provide a layer of $Al_{0.95}In_{0.05}N$, which has a higher Al ratio than the buffer layer 21 on the Si substrate 11, to a thickness of 20 nm. With such a structure, the state of the interface between the Si substrate 11 and the column-like multi-layer structure 20 is improved.

After the buffer layer 21 is formed, the supply of TMA is stopped and Si-doped $Ga_{0.92}In_{0.08}N$ is crystal-grown still at 800° C. to a thickness of about 1.5 μm, thereby forming the first clad layer 22 of n-type.

The first clad layer 22 may be formed of GaN, which is obtained by increasing the temperature after the buffer layer 21 is formed. The first clad layer 22 may also be formed of GaInN, which includes In and excludes Al. The GaInN layer can be grown at a lower temperature, which contributes-to the suppression of crack generation in the Si substrate 11.

When GaN is used for the first clad layer 22 of n-type, the GaN layer is crystal-grown by supplying an organic metal at a growth rate of 6 μm/min., which is the same as the growth rate of the GaInN layer or of the other layers. When the width of the mask layer 41 (i.e., the inter-opening distance 44) is 40 μm or less as described above, the growth rate of the GaN layer is preferably 6 μm/min. or less, for the following reason. When the growth rate is increased to more than 6 μm/min., for example, 10 μm/min., by increasing the supply amount of TMG, in order to enhance the productivity, a polycrystalline substance is deposited on the mask layer 41 having a width (i.e., the inter-opening distance 44) of 40 μm or less. This substance shortcircuits a p-n junction and thus causes a leak current, resulting in a reduction in the luminance of the nitride semiconductor light emitting device 100. It is also preferable to control the growth rate of all the layers.

After the first clad layer 22 is formed, the supply of TMA, TMI, and TMG is stopped, and the substrate temperature is lowered to 760° C. Then, TMI and TMG are supplied at respective flow rates of 6.5 μmol/min. and 2.8 μmol./min, thereby growing a well layer containing $In_{0.18}Ga_{0.82}N$ to a thickness of 3 nm. Then, the temperature is raised to 850° C., and TMG is supplied at a flow rate of 14 μmol/min., thereby growing a barrier layer containing GaN. The growth of the well layer and the barrier layer is repeated in this manner, thereby forming a multiple quantum well (MQW) layer including five well layers and five barrier layers provided alternately. The multiple quantum well (MQW) layer acts as the light emitting layer 23.

After the light emitting layer 23 is formed, TMG, TMA, and TMI are supplied at respective flow rates of 11 μmol/min., 1.1 μmol/min. and 40 μmol/min. at substantially the same temperature as used for growing the uppermost barrier layer. Concurrently, biscyclopentadienyl magnesium ($Cp_2Mg$), which is a p-type doping gas, is supplied at a flow rate of 10 nmol/min. Thus, the carrier block layer 24 of p-type containing Mg-doped $Al_{0.20}Ga_{0.75}In_{0.05}N$ is grown to a thickness of 50 nm.

After the carrier block layer 24 is formed, the supply of TMA is stopped. Thus, Mg-doped GaN is crystal-grown at substantially the same temperature, thereby forming the second clad layer 25 of p-type $Ga_{0.09}In_{0.01}N$ to a thickness of 100 nm.

In this manner, the column-like multi-layer structure 20 is formed in each mask opening 42. Then, the supply of TMG, TMI and $Cp_2Mg$ is stopped and the temperature is lowered to room temperature. Then, the resultant laminate is removed from the MOCVD apparatus.

As described above, the inter-opening distance 44 is in the range of twice the designed thickness 26 to 40 μm. Therefore, the edge growth is negligibly small, and two adjacent column-like multi-layer structures 20 are not combined together. For these reasons, the generation of cracks is prevented.

Figure 4:
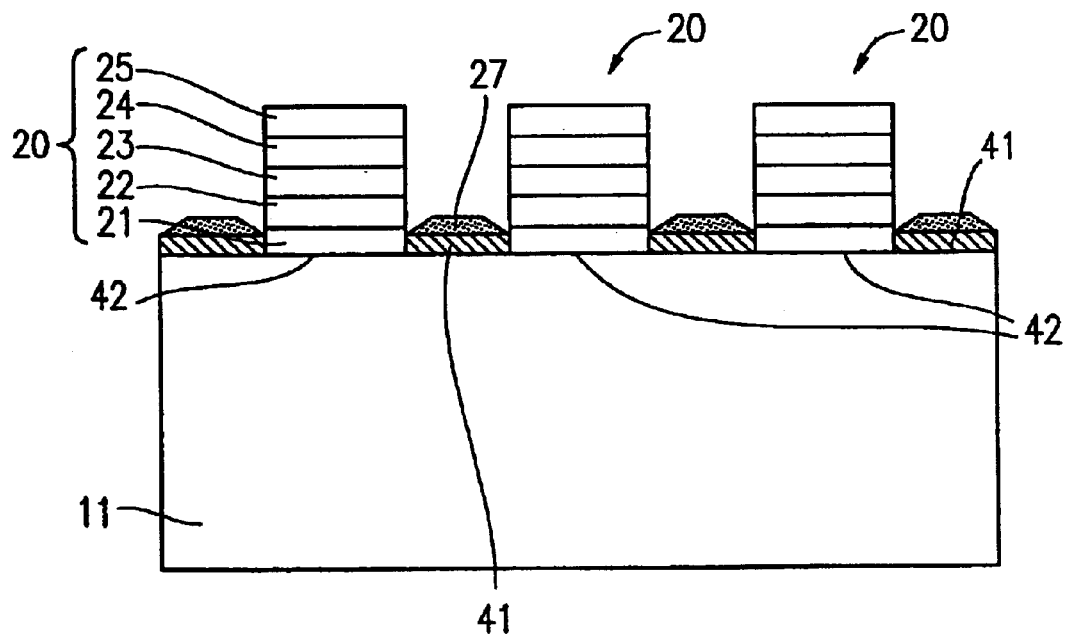
FIG. 4 is a schematic cross-sectional view of a laminate obtained during the production of the semiconductor light emitting device shown in FIG. 1.
Figure 5:
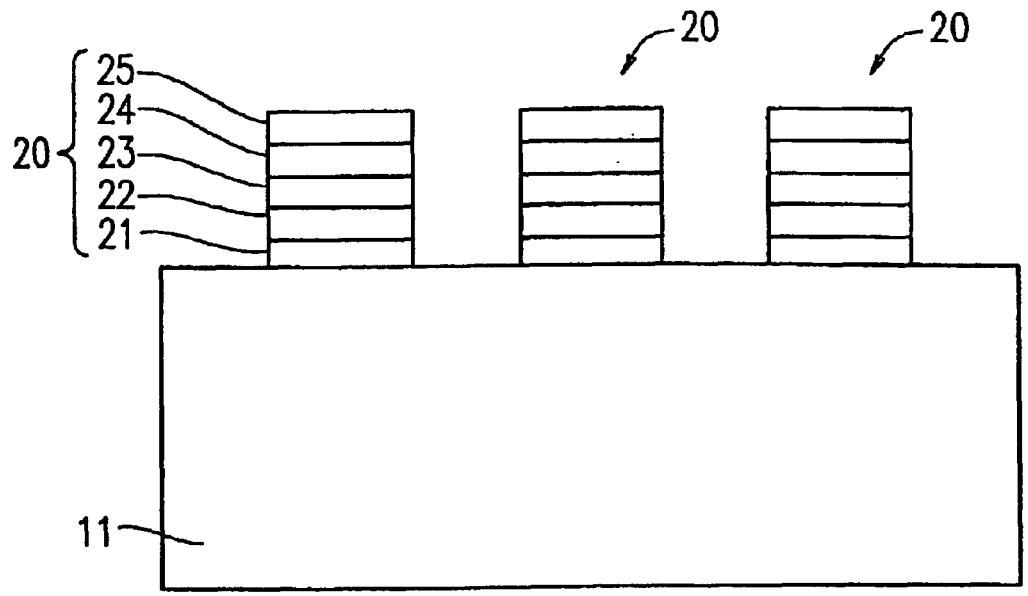
FIG. 5 is a schematic cross-sectional view of a laminate obtained during the production of the semiconductor light emitting device shown in FIG. 1.

As shown in FIG. 4, the laminate removed from the MOCVD layer has a substance 27 on the mask layer 41. The formation of the substance 27 is not avoidable by simply controlling the growth rate of the materials supplied in the MOCVD. The substance 27 and the mask layer 41 are removed by forming a mask layer using photolithography and then performing RIE. Thus, the laminate shown in FIG. 5 (schematic cross-sectional view) is obtained.

Then, as shown in FIG. 1, the insulating layer 31 is formed between the column-like multi-layer structures 20. The insulating layer 31 is formed such that the column-like multi-layer structures 20 are not shortcircuited when the transparent electrode 16 is provided in a later step.

On an entire surface of the insulating layer 31, the transparent electrode 16 is formed so as to cover the second clad layer 25 (p-type $Ga_{0.9}In_{0.1}N$) of all the column-like multi-layer structures 20. By this step, the column-like multi-layer structures 20, which are insulated from each other by the insulating layer 31, are now electrically connected to each other by the transparent electrode 16.

Then, the bonding electrodes 17 are formed on the transparent electrode 16, such that one bonding electrode 17 is provided at one corner of each chip of the nitride semiconductor light emitting device 100 after dicing. The one corner is the corner at which no column-like multi-layer structures 20 are provided. The rear electrode 19 is formed on a bottom surface of the Si substrate 11. The resultant laminate is divided into a plurality of chips by dicing. Each chip has a size of, for example, 300 μm. Thus, the nitride semiconductor light emitting device 100 shown in FIGS. 1 and 2 is produced.

In the nitride semiconductor light emitting device 100 according to the first example, the column-like multi-layer structures 20 are insulated from each other by the insulating layer 31. Therefore, the transparent electrode 16 for connecting all the column-like multi-layer structures 20 needs to be provided. One bonding electrode 17 is provided for the transparent electrode 16 in each chip.

The nitride semiconductor light emitting device 100 operates as follows. A voltage is externally applied to the transparent electrode 16 via the bonding electrode 17, and thus the voltage is applied to each of the column-like multi-layer structures 20 which are insulated from each other by the insulating layer 31. By the voltage difference between each column-like multi-layer structure 20 and the rear electrode 19 on the bottom surface of the Si substrate 11, light is emitted from the light emitting layer 23 of each column-like multi-layer structure 20. The light emitted from the light emitting layer 23 is directed upward from the top surface of each column-like multi-layer structure 20 through the transparent electrode 16.

As described above, in the first example, the inter-opening distance 44 is 40 μm or less. Therefore, the concentration distribution of the nitride semiconductor material staying on the mask layer 41 is uniform in a direction parallel to the surface of the Si substrate 11. This overcomes the problem of the conventional device that, the concentration of the material is especially high in a peripheral portion of the column-like multi-layer structure 20 in the mask opening 42 in the vicinity of the mask layer 41. The column-like multi-layer structure 20 is grown so as to have a uniform thickness entirely in each mask opening 42 without edge growth. Consequently, the generation of cracks is suppressed.

The inter-opening distance 44 is at least twice the designed thickness 26 of the column-like multi-layer structure 20. This prevents two adjacent column-like multi-layer structures 20 from being combined together. Therefore, even using the Si substrate 11, substantially no cracks are generated.

The present invention is not limited to using an Si substrate and is applicable to using any substrate formed of a material having a smaller thermal expansion coefficient than that of a nitride semiconductor material.

In the first example, the light emitting layer 23 contains $In_xGa_{1-x}N$. Alternatively, the light emitting layer 23 may contain a group III–V nitride semiconductor material which includes at least one of InGaAlN, GaAsN, GaInAsN, GaPN and GaInPN, each of which mainly contains N as a group V element.

In the first example, the mask layer 41 is formed of silicon oxide. The mask layer 41, which is provided for the purpose of improving the selectability in growth of nitride semiconductor materials, may be formed of silicon nitride, aluminum oxide or the like.

In the first example, the mask openings 42 are square, but may be rectangular, triangular, or of other polygonal shapes.

Figure 6:
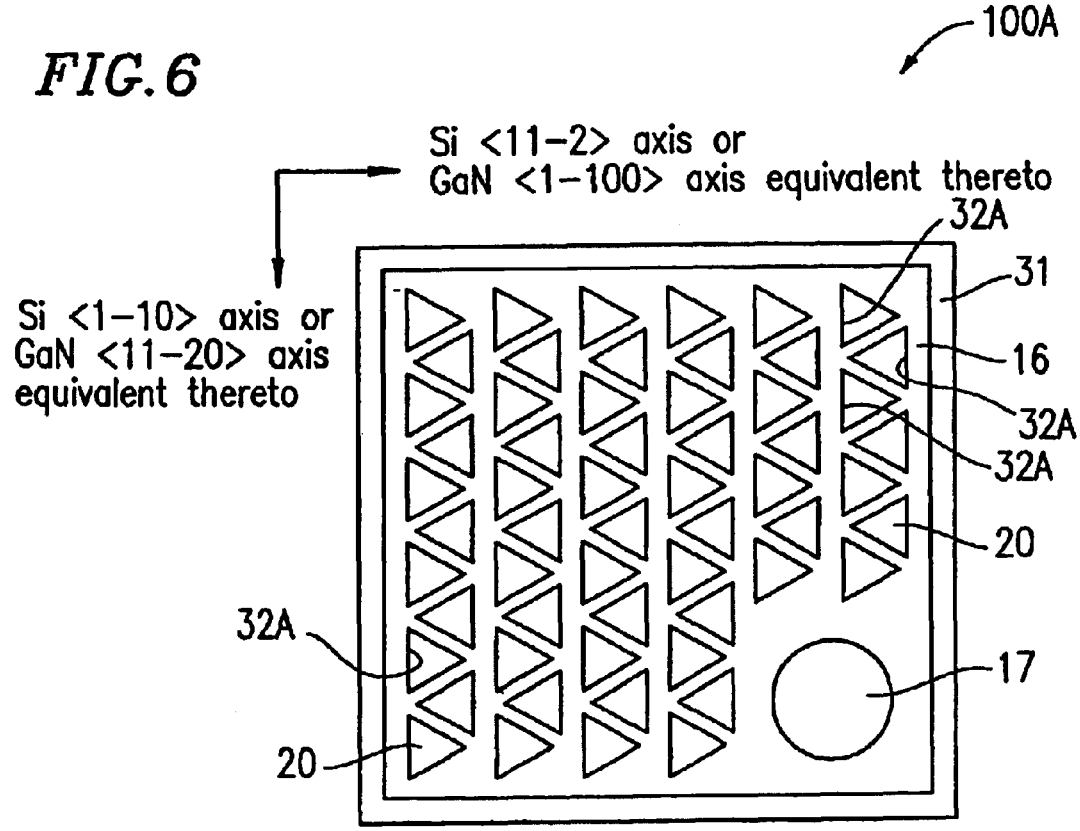
FIG. 6 is a schematic plan view of another semiconductor light emitting device according to the first example of the present invention.

FIG. 6 is a schematic plan view of another nitride semiconductor light emitting device 100A according to the first example of the present invention.

In the nitride semiconductor light emitting device 100A, the insulating layer 31 provided on the Si substrate 11 has a plurality of equilateral triangular openings 32A. As described above, the crystal growth directions of the nitride semiconductor materials provided on the Si substrate 11 are the Si <11-2> direction and the Si <1-10> direction which are perpendicular to each other. The openings 32A may be aligned such that one side of the triangles is on a straight line along the <1-10> direction. The apex of the triangle is in the <11-2> direction from the center of the one side. Every two adjacent triangles aligned in this manner interpose another triangle having one side aligned on a straight line in the <1-10> direction. The apex of the another triangle is in the opposite direction to the <11-2> direction from the center of the one side.

The nitride semiconductor light emitting device 100A includes column-like multi-layer structure 20 in each of the triangular openings 32A, and the transparent electrode 16, the bonding electrode 17 and the rear electrode 19.

In the case where the column-like multi-layer structure 20 is formed of a hexagonal-system gallium nitride-based compound semiconductor material, the generation of cracks is likely to occur in a direction parallel to the <11-20> axis of the GaN layer. In order to avoid the generation of cracks, the GaN layer is formed such that the <11-20> axis thereof is parallel to one side of the triangular openings 32A (in the case where the openings have a polygonal shape having four or more corners, such that the <11-20> axis thereof is parallel to at least one side thereof). In the case where the Si substrate 11 has a (111) plane, the GaN layer is formed such that the <11-20> axis thereof is parallel to the Si <1-10> axis of the Si substrate 11.

EXAMPLE 2

Figure 7:
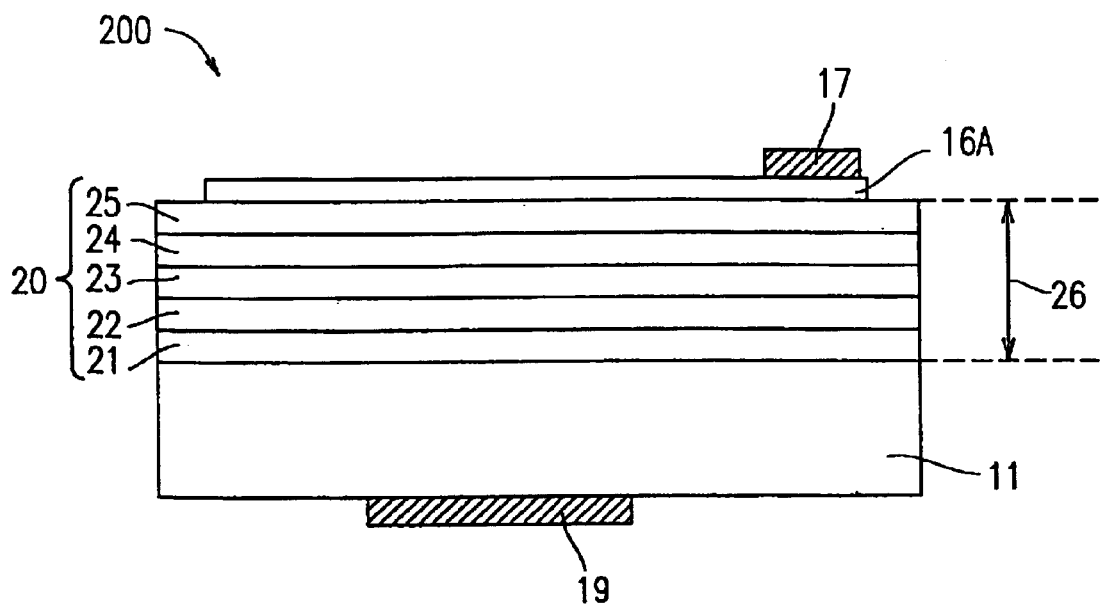
FIG. 7 is a schematic cross-sectional view of a semiconductor light emitting device according to a second example of the present invention.
Figure 8:
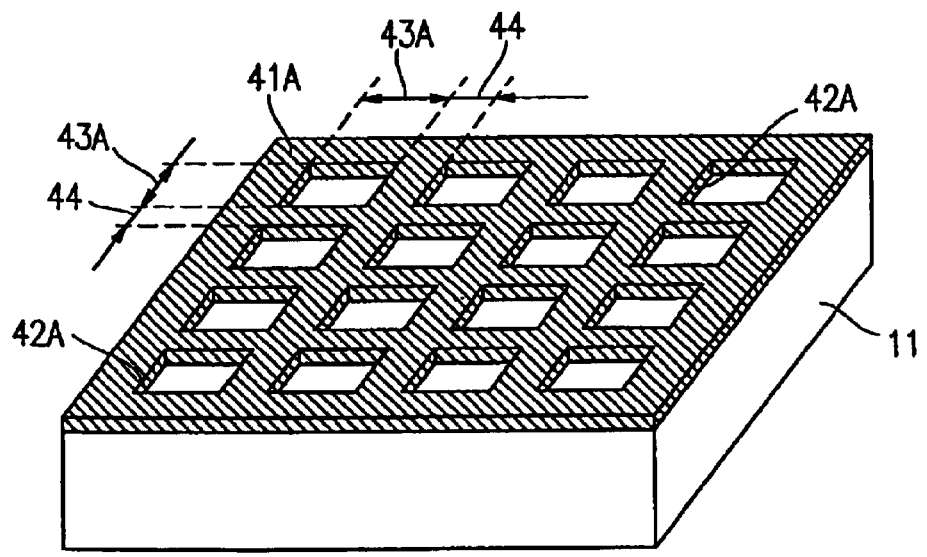
FIG. 8 is a schematic isometric view of a laminate obtained during the production of the semiconductor light emitting device shown in FIG. 7.

FIG. 7 is a schematic cross-sectional view of a nitride semiconductor light emitting device 200 according to a second example of the present invention. FIG. 8 is a schematic isometric view of an assembly of an Si substrate 11 and a mask layer 41A provided thereon. Identical elements previously discussed with respect to FIGS. 1 through 6 in the first example bear identical reference numerals and the detailed descriptions thereof will be omitted.

The nitride semiconductor light emitting device 200 is different from the nitride semiconductor light emitting device 100 mainly in the following points. The width of a mask opening 42A has a larger width 43A of 200 μm. Each column-like multi-layer structure 20 is provided with one transparent electrode 16A, one bonding electrode 17A, and one rear electrode 19. One chip of the nitride semiconductor light emitting device 200 obtained by dicing includes one column-like multi-layer structure 20.

With reference to FIG. 7, the nitride semiconductor light emitting device 200 includes the Si substrate 11 having a (111) plane and a column-like multi-layer structure 20 provided on the Si substrate 11 by crystal-growing nitride semiconductor materials.

The column-like multi-layer structure 20 includes a buffer layer 21 provided on the surface of the Si substrate 11. The buffer layer 21 contains Si-doped n-AlInN. The column-like multi-layer structure 20 further includes a first clad layer 22 containing n-GaInN, a light emitting layer 23 containing $In_xGa_{1-x}N$, a carrier block layer 24 containing p-AlGaInN, and a second clad layer 25 containing p-GaInN. The layers 22, 23, 24 and 25 are stacked on the buffer layer 21 in this order.

The second clad layer 25 is substantially entirely covered with a transparent electrode 16A. On a corner of the transparent electrode 16A, a cylindrical bonding electrode 17A is provided for externally supplying electric current to the transparent electrode 16A. On a bottom surface of the Si substrate 11, a rear electrode 19 is provided.

The nitride semiconductor light emitting device 200 having the above-described structure is produced in the following manner.

First, steps for forming a mask layer 41A having a plurality of mask openings 42A will be described with reference to FIG. 8.

After the Si substrate 11 is washed, an $SiO_2$ layer to be formed into the mask layer 41A is deposited on the Si substrate 11 by sputtering to a prescribed thickness (e.g., 100 nm). In the $SiO_2$ layer, the plurality of mask openings 42A, in each of which the column-like multi-layer structure 20 is to be epitaxially grown, are formed in a prescribed matrix by photolithography and etching. Thus, the mask layer 41A is formed. Each mask opening 42A is square in this example, but may be rectangular. Each mask opening 42A has the width 43A of about 200 μm, which is twice the width 43 in the first example. An inter-opening distance 44 between every two adjacent mask openings 42A is about 5 μm, like in the first example. The width 43A of the mask opening 43 is preferably in the range of 200 μm to 300 μm.

The inter-opening distance 44 is preferably in the range of twice the designed thickness 26 (FIG. 7) to 40 μm, like in the first example. With the inter-opening distance 44 of such a size, the degree of edge growth is negligibly small and two adjacent column-like multi-layer structures 20 are not combined together. Thus, the nitride semiconductor light emitting device 200 is almost crack-free.

After the plurality of mask openings 42A are formed in the mask layer 41A so as to expose the surface of the Si substrate 11, the surface of the Si substrate 11 is washed and an assembly of the Si substrate 11 and the mask layer 41A is put into an MOCVD apparatus. The Si substrate 11 is washed at a temperature of as high as 1100° C. in a hydrogen ($H_2$) atmosphere.

Then, the column-like multi-layer structure 20 is grown as follows. While supplying $N_2$ as a carrier gas at a flow rate of 10 L/min. to the MOCVD apparatus, $NH_3$, trimethyl aluminum (TMA) and trimethyl indium (TMI) are supplied at 800° C., at respective flow rates of 5 L/min., 20 μmol/min., and 137 μmol/min. Several seconds later, $SiH_4$ gas is introduced to the MOCVD apparatus, thereby performing Si doping. Thus, the buffer layer 21 of $Al_{0.85}In_{0.15}N$ is grown in each mask opening 42A to a thickness of about 30 nm.

In the above-described crystal growth of MOVPE, organic metals (TMA and TMI) as a group III gas are supplied several seconds before $NH_3$ gas of the group V. This flattens the buffer layer 21, for the following possible reason. In the case where $NH_3$ gas is supplied before the organic metals, the surface of the Si substrate 11 is nitrided. By contrast, when the organic metals are supplied before $NH_3$ gas, the surface of the Si substrate 11 is prevented from being nitrided, and a group III element is provided on the surface of the Si substrate 11. The precise timing for supplying the organic metals before the $NH_3$ gas varies depending on the specifications of the MOCVD apparatus.

Before providing the buffer layer 21, it is preferable to provide a layer of $Al_{0.95}In_{0.05}N$, which has a higher Al ratio than the buffer layer 21 on the Si substrate 11, to a thickness of 20 nm. With such a structure, the state of the interface between the Si substrate 11 and the column-like multi-layer structure 20 is improved.

After the buffer layer 21 is formed, the supply of TMA is stopped and Si-doped $Ga_{0.92}In_{0.08}N$ is crystal-grown at 800° C. to a thickness of about 1.5 μm, thereby forming the first clad layer 22 of n-type.

After the first clad layer 22 is formed, the supply of TMA, TMI, and TMG is stopped, and the substrate temperature is lowered to 760° C. Then, TMI and TMG are supplied at respective flow rates of 6.5 μmol/min. and 2.8 μmol./min, thereby growing a well layer containing $In_{0.18}Ga_{0.82}N$ to a thickness of 3 nm. Then, the temperature is raised to 850° C., and TMG is supplied at a flow rate of 14 μmol/min., thereby growing a barrier layer containing GaN. The growth of the well layer and the barrier layer is repeated in this manner, thereby forming a multiple quantum well (MQW) layer including five well layers and five barrier layers provided alternately. The multiple quantum well (MQW) layer acts as the light emitting layer 23.

After the light emitting layer 23 is formed, TMG, TMA, and TMI are supplied at respective flow rates of 11 μmol/min., 1.1 μmol/min., and 40 μmol/min. at substantially the same temperature as used for growing the uppermost barrier layer. Concurrently, biscyclopentadienyl magnesium ($Cp_2Mg$) which is a p-type doping gas, is supplied at a flow rate of 10 nmol/min. Thus, the carrier block layer 24 of p-type containing Mg-doped $Al_{0.20}Ga_{0.75}In_{0.05}N$ is grown to a thickness of 50 nm.

After the carrier block layer 24 is formed, the supply of TMA is stopped. Thus, Mg-doped GaN is crystal-grown, thereby forming the second clad layer 25 of p-type GaN to a thickness of 100 nm.

In this manner, the column-like multi-layer structure 20 is formed in each mask opening 42A. Then, the supply of TMG, TMI and $Cp_2Mg$ is stopped and the temperature is lowered to room temperature. Then, the resultant laminate is removed from the MOCVD apparatus.

On each second clad layer 25, the transparent electrode 16A is formed. Then, the bonding electrode 17A is formed on a corner of the transparent electrode 16A. The rear electrode 19A is formed on a bottom surface of the Si substrate 11 in positional correspondence with each column-like multi-layer structure 20. The resultant laminate is divided into a plurality of chips by dicing, such that each chip includes one column-like multi-layer structure 20.

In the second example, the inter-opening distance 44 is in the range of twice the designed thickness 26 to 40 μm as in the first example. In this state, the column-like multi-layer structure 20 is grown in each mask opening 42A. Therefore, the same effect as in the first example is provided.

EXAMPLE 3

Figure 9:
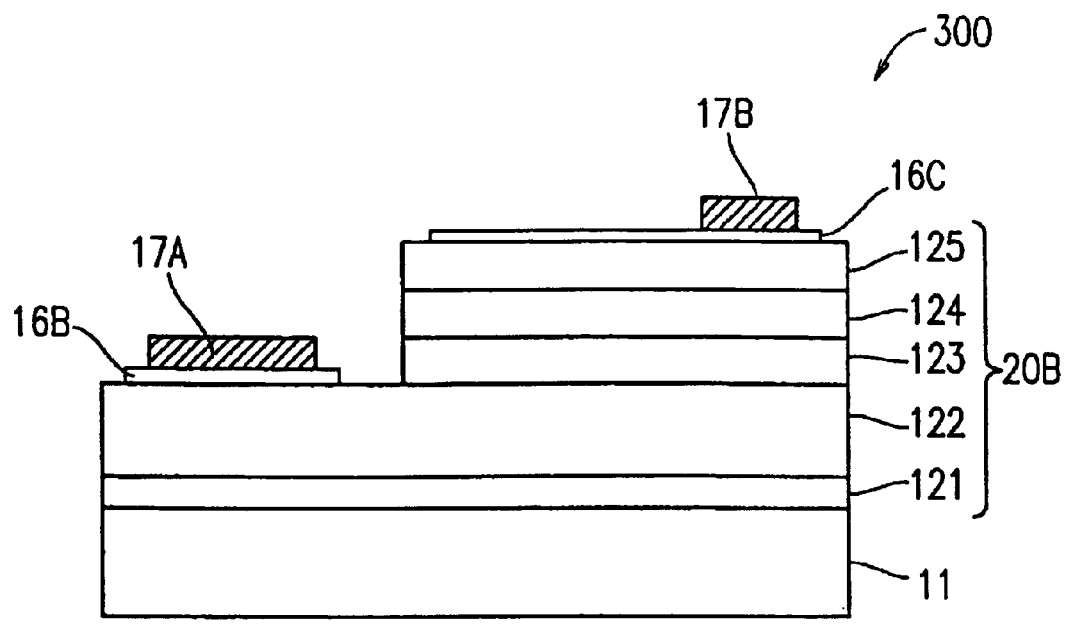
FIG. 9 is a schematic cross-sectional view of a semiconductor light emitting device according to a third example of the present invention.
Figure 10:
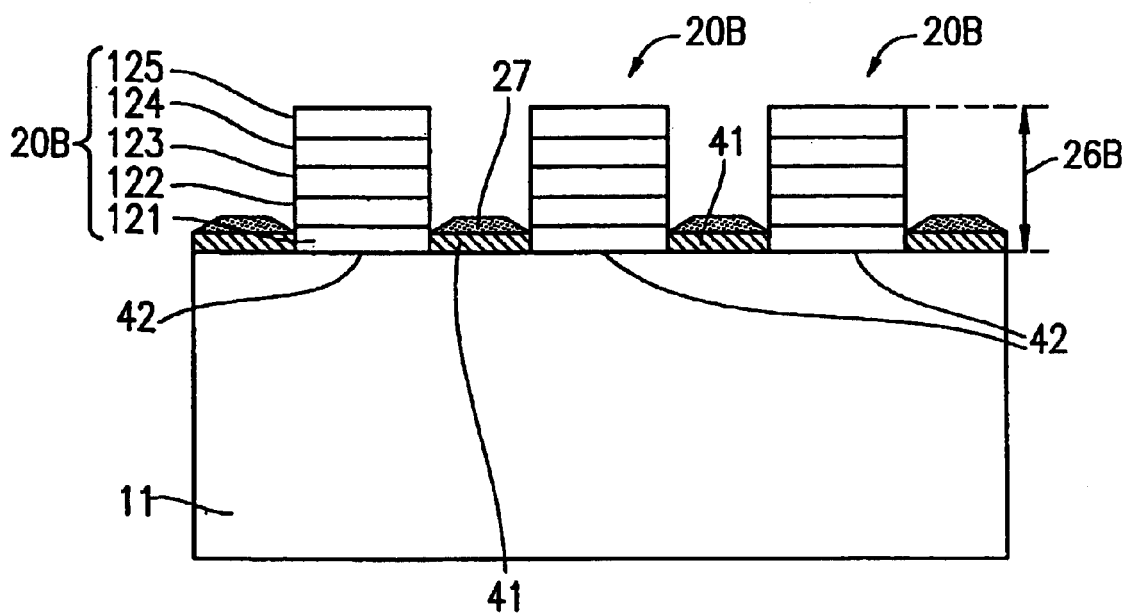
FIG. 10 is a schematic cross-sectional view of a laminate obtained during the production of the semiconductor light emitting device shown in FIG. 9.

FIG. 9 is a schematic cross-sectional view of a nitride semiconductor light emitting device 300 according to a third example of the present invention. FIG. 10 is a schematic isometric view of an assembly of an Si substrate 11 and a plurality of column-like multi-layer structures 20B provided thereon. Identical elements previously discussed with respect to FIGS. 1 through 6 in the first example bear identical reference numerals and the detailed descriptions thereof will be omitted.

The nitride semiconductor light emitting device 300 includes an AlN layer 121 provided on the Si substrate 11. The Si substrate 11 has a (111) plane.

The column-like multi-layer structure 20B includes the AlN layer 121 provided so as to cover the surface of the Si substrate 11. The column-like multi-layer structure 20B further includes a first clad layer 122 containing Si-doped n-GaN provided so as to cover an entire surface of the AlN layer 121, a light emitting layer 123 containing $In_xGa_{1-x}N$ provided so as to cover a part of a surface of the first clad layer 122, a carrier block layer 124 containing p-AlGaN, and a second clad layer 125 containing p-GaN. The layers 123, 124 and 125 are stacked in an aligned state in this order.

A transparent electrode 16C is provided on the second clad layer 125. A cylindrical bonding electrode 17B is provided on the transparent electrode 16C for externally supplying electric current to the transparent electrode 16C. A transparent electrode 16B is provided on the first clad layer 122, and a cylindrical bonding electrode 17A is provided on the transparent electrode 16B for externally supplying electric current to the transparent electrode 16B.

The nitride semiconductor light emitting device 300 having the above-described structure is produced in the following manner.

As in the first example (FIG. 3), the plurality of mask openings 42 are formed in the mask layer 41 so as to expose the surface of the Si substrate 11. The surface of the Si substrate 11 is washed for 1 minute with an organic solvent and a 5% aqueous solution of HF.

As in the first example, the inter-opening distance 44 is preferably in the range of twice a designed thickness 26B of the column-like multi-layer structure 20B to 40 μm. With the inter-opening distance 44 in this range, the degree of edge growth is negligibly small and two adjacent column-like multi-layer structures 20B are not combined together. Thus, the nitride semiconductor light emitting device 300 is almost crack-free.

Then, the assembly of the Si substrate 11 and the mask layer 41 is put into an MOCVD apparatus. The Si substrate 11 is washed at a temperature of as high as 1100° C. in a hydrogen ($H_2$) atmosphere.

Then, the column-like multi-layer structure 20B is grown as follows. While supplying $H_2$ as a carrier gas at a flow rate of 10 L/min. to the MOCVD apparatus, $NH_3$, trimethyl aluminum (TMA) and trimethyl indium (TMI) are supplied at 1200° C., at respective flow rates of 5 L/min., 20 μmol/min., and 137 μmol/min. Thus, the AlN layer 121 is grown in each mask opening 42 to a thickness of about 200 nm.

After the AlN layer 121 is formed, TMG is supplied at a flow rate of about 20 μmol/min. at 1050° C. and Si-doped GaN is crystal-grown to a thickness of about 1.5 μm, thereby forming the first clad layer 122 of n-type.

After the first clad layer 122 is formed, the supply of TMA, TMI, and TMG is stopped, and the substrate temperature is lowered to 760° C. Then, TMI and TMG are supplied at respective flow rates of 6.5 μmol/min., and 2.8 μmol./min, thereby growing a well layer containing $In_{0.18}Ga_{0.82}N$ to a thickness of 3 nm. Then, the temperature is raised to 850° C., and TMG is supplied at a flow rate of 14 μmol/min., thereby growing a barrier layer containing GaN. The growth of the well layer and the barrier layer is repeated in this manner, thereby forming a multiple quantum well (MQW) layer including five well layers and five barrier layers provided alternately. The multiple quantum well (MQW) layer acts as the light emitting layer 123.

After the light emitting layer 123 is formed, the temperature is raised to 1050° C. and TMG and TMA are supplied at respective flow rates of 11 μmol/min., and 1.1 μmol/min. Concurrently, biscyclopentadienyl magnesium ($Cp_2Mg$), which is a p-type doping gas, is supplied at a flow rate of 10 nmol/min. Thus, the carrier block layer 124 of p-type containing Mg-doped $Al_{0.12}Ga_{0.88}N$ is grown to a thickness of 20 nm.

After the carrier block layer 124 is formed, the supply of TMA is stopped. Thus, Mg-doped GaN doped is crystal-grown at substantially the same atmosphere, thereby forming the second clad layer 125 of p-type GaN to a thickness of 100 nm.

In this manner, the column-like multi-layer structure 20B is formed in each mask opening 42. Then, the supply of TMG and Cp$_2$Mg is stopped and the temperature is lowered to room temperature. Then, the resultant laminate is removed from the MOCVD apparatus.

On each second clad layer 125, the transparent electrode 16C is formed. Then, the bonding electrode 17B is formed on a part of the transparent electrode 16C. The light emitting layer 123, the carrier block layer 124 and the second clad layer 125 are partially etched by RIE, so as to expose a part of the surface of the first clad layer 122. The transparent electrode 16B is formed on the exposed surface of the first clad layer 122. On a part of a surface of the transparent electrode 16B, the bonding electrode 17A, which is an n-side electrode, is formed. The resultant laminate is divided into a plurality of chips by dicing, such that each chip includes one column-like multi-layer structure 20B. Thus, the nitride semiconductor light emitting device 300 shown in FIG. 9 is produced.

In the third example, the inter-opening distance 44 is in the range of twice the designed thickness 26B to 40 µm as in the first example. In this state, the column-like multi-layer structure 20B is grown in each mask opening 42. Therefore, the same effect as in the first example is provided.

EXAMPLE 4

Figure 11:
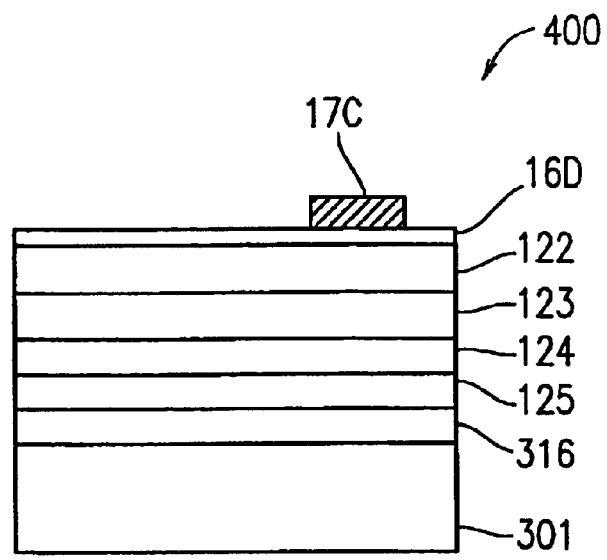
FIG. 11 is a schematic cross-sectional view of a semiconductor light emitting device according to a fourth example of the present invention.
Figure 12:
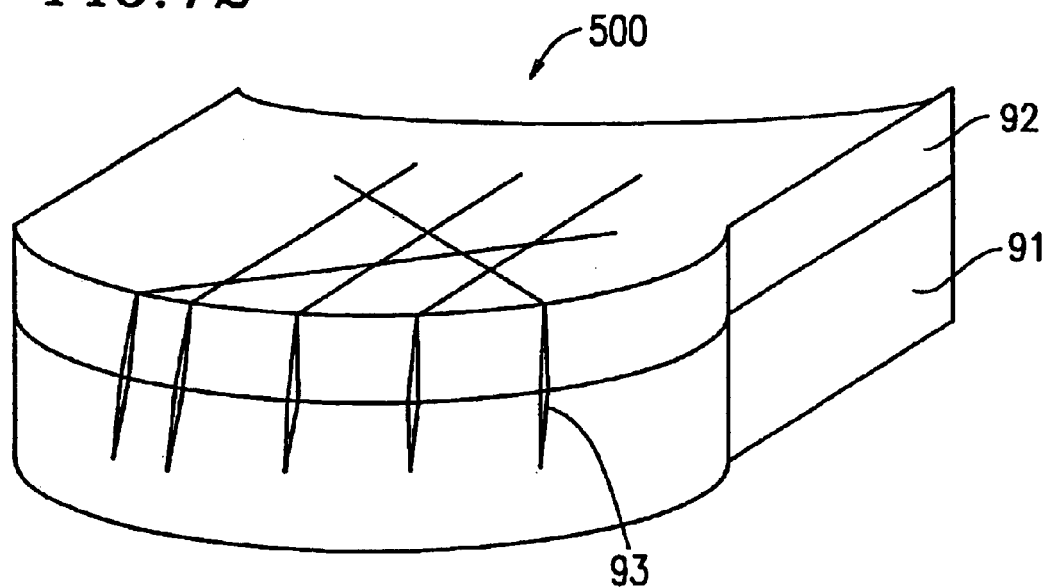
FIG. 12 is a schematic isometric view of a conventional semiconductor light emitting device.
Figure 13:
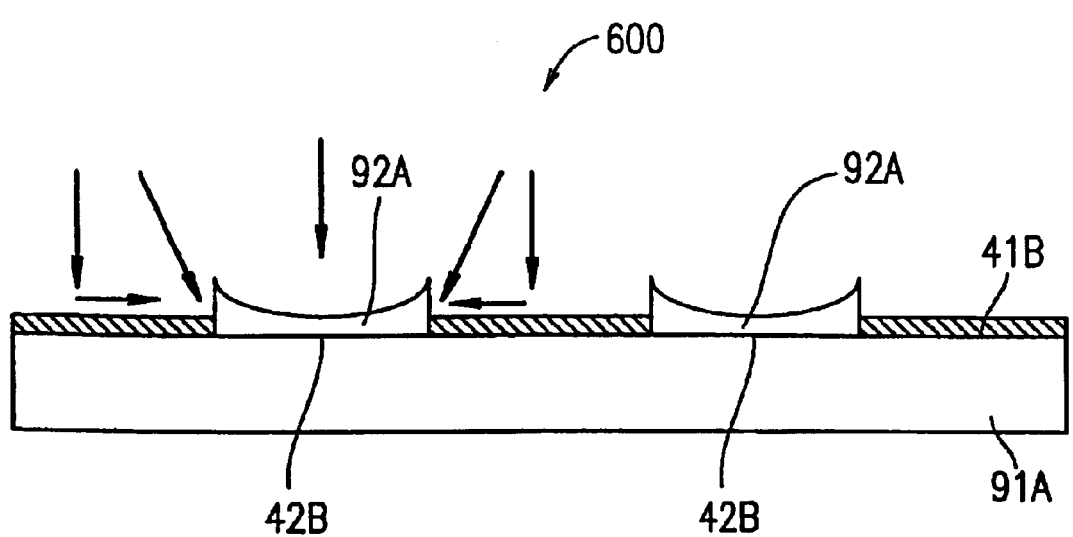
FIG. 13 is a schematic cross-sectional view of another conventional semiconductor light emitting device.

FIG. 11 is a schematic cross-sectional view of a nitride semiconductor light emitting device 400 according to a fourth example of the present invention. Identical elements previously discussed with respect to FIGS. 1 through 6 in the first example and FIGS. 9 and 10 in the third example bear identical reference numerals and the detailed descriptions thereof will be omitted.

The nitride semiconductor light emitting device 400 is produced based on the column-like multi-layer structures 20B produced in the third example using the MOCVD apparatus.

The nitride semiconductor light emitting device 400 includes an Ni plating layer 301, and a p-side electrode 316 provided so as to cover an entire surface of the Ni plating layer 301. The nitride semiconductor light emitting device 400 further includes a second clad layer 125 containing p-GaN, a carrier block layer 124 containing p-AlGaI, a light emitting layer 123 containing In$_x$Ga$_{1-x}$N, and a first clad layer 122 containing Si-doped n-GaN. The layers 316, 125, 124, 123 and 122 are stacked in an aligned state in this order. A transparent electrode 16D is provided on the first clad layer 122. A cylindrical bonding electrode 17C is provided on the transparent electrode 16D for externally supplying electric current to the transparent electrode 16D.

The nitride semiconductor light emitting device 400 having the above-described structure is produced in the following manner.

As in the third example, the assembly of the Si substrate 11 and the column-like multi-layer structure 20B formed in each of the plurality of mask openings 42 is formed. The assembly is removed from the MOCVD apparatus. The electrode 316, as a p-side electrode, having a thickness of 200 nm is formed on the second clad layer 125 by EB vapor deposition. On the p-side electrode 316, the Ni plating layer 301 is formed by plating to a thickness of 300 µm. The Si substrate 11 is removed with a hydrogen fluoride-based etchant. Then, the AlN layer 121 having a high resistance is removed by RIE. As a result, the first clad layer 122 is exposed. The transparent electrode 16D is formed on the first clad layer 122, and the bonding electrode 17C is formed on a part of the surface of the transparent electrode 16D. The resultant laminate is divided into a plurality of chips having a size of, for example, about 250 µm by dicing. Thus, the nitride semiconductor light emitting device 400 shown in FIG. 11 is produced.

The nitride semiconductor light emitting device 400 appears the same as a nitride semiconductor light emitting device produced without controlling the inter-opening distance to be in the range of twice the designed thickness of the column-like multi-layer structure to 40 µm. However, the nitride semiconductor light emitting device 400 is produced based on the column-like multi-layer structures 20B produced with such control (i.e., control such that the inter-opening distance is in the range of twice the designed thickness of the column-like multi-layer structure to 40 µm). Therefore, the nitride semiconductor light emitting device 400 provides the same effect as that in the third example.

As described above, the present invention provides a method for a nitride semiconductor light emitting device including an Si substrate, in which generation of cracks at an interface between the Si substrate and the nitride semiconductor layers is suppressed; and a nitride semiconductor light emitting device produced by such a method.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor light emitting device, comprising the steps of:

forming a mask layer having a plurality of openings on a surface of a silicon substrate; and forming a column-like multi-layer structure including a light-emitting layer in each of the plurality of openings with nitride semiconductor materials, wherein a width between two adjacent openings of the plurality of openings of the mask layer is 10 µm or less such that the concentration distribution of the nitride semiconductor materials is uniform in a direction parallel to the surface of the silicon substrate.

2. A semiconductor light emitting device produced by a method according to claim 1.

3. A method for producing a semiconductor light emitting device, comprising the steps of:

forming a mask layer having a plurality of openings on a surface of a silicon substrate; and forming a column-like multi-layer structure including a light emitting layer in each of the plurality of openings with nitride semiconductor materials, wherein a width between two adjacent openings of the plurality of openings of the mask layer is in the range of twice a thickness of the column-like multi-layer structure to 40 µm such that the concentration distribution of the nitride semiconductor materials is uniform in a direction parallel to the surface of the silicon substrate, the thickness being in a direction vertical to the planar direction of the silicon substrate.

4. A method for producing a semiconductor light emitting device according to claim 3, further comprising the steps of:

forming a transparent electrode on each column-like multi-layer structure; and dividing an assembly of the silicon substrate and the column-like multi-layer structures into a plurality of chips, such that each chip includes one column-like multi-layer structure.

5. A method for producing a semiconductor light emitting device according to claim 3, wherein:

the plurality of openings are each square or rectangular, and the plurality of openings each have a side in the range of 50 μm to 150 μm.

6. A method for producing a semiconductor light emitting device according to claim 3, wherein:

the plurality of openings are each square or rectangular, and the plurality of openings each have a side in the range of 200 μm to 300 μm.

7. A method for producing a semiconductor light emitting device according to claim 3, wherein the mask layer is formed of a material selected from the group consisting of silicon oxide, silicon nitride, and aluminum oxide.

8. A semiconductor light emitting device produced by a method according to claim 3.

9. A method for producing a semiconductor light emitting device, comprising the steps of:

forming a mask layer having a plurality of openings on a surface of a silicon substrate; and forming a column-like multi-layer structure including a light emitting layer in each of the plurality of openings with nitride semiconductor materials, wherein a width between two adjacent openings of the plurality of openings of the mask layer is in the range of twice a thickness of the column-like multi-layer structure to 40 μm, the thickness being in a direction vertical to the planar direction of the silicon substrate; and further comprising the steps of:

removing the mask layer and providing an insulating layer for electrically insulating the column-like multi-layer structures from each other on an area of the surface of the silicon substrate from which the mask layer has been removed, and forming a transparent electrode for electrically connecting the column-like multi-layer structures to each other.

10. A method for producing a semiconductor light emitting device, comprising the steps of:

forming a mask layer having a plurality of openings on a surface of a silicon substrate; and forming a column-like multi-layer structure including a light emitting layer in each of the plurality of openings with nitride semiconductor materials, wherein a width between two adjacent openings of the plurality of openings of the mask layer is in the range of twice a thickness of the column-like multi-layer structure to 40 μm, the thickness being in a direction vertical to the planar direction of the silicon substrate;

each column-like multi-layer structure includes a hexagonal-system gallium nitride-based compound semiconductor material, the plurality of openings are polygonal, and at least one side of each polygonal opening is parallel to a <11-20> axis of the gallium nitride-based compound semiconductor material.

11. A method for producing a semiconductor light emitting device according to claim 10, wherein:

the silicon substrate has an Si (111) plane, and a <1-10> axis of the silicon substrate is parallel to the <11-20> axis of the gallium nitride-based compound semiconductor material.

* * * * *